United States Patent
Lee et al.

(10) Patent No.: US 11,412,644 B2
(45) Date of Patent: *Aug. 9, 2022

(54) MAGNETIC SHIELDING UNIT FOR WIRELESS POWER TRANSMISSION AND WIRELESS POWER TRANSMISSION MODULE INCLUDING SAME

(71) Applicant: Amotech Co., Ltd., Incheon (KR)

(72) Inventors: Woong Yong Lee, Incheon (KR); Kil Jae Jang, Seongnam-si (KR); Seong Tae Kim, Daegu (KR); Su Jung Kim, Incheon (KR)

(73) Assignee: Amotech Co., Ltd., Incheon (KR)

( * ) Notice: Subject to any disclaimer, the term of this patent is extended or adjusted under 35 U.S.C. 154(b) by 959 days.

This patent is subject to a terminal disclaimer.

(21) Appl. No.: 15/776,249

(22) PCT Filed: Nov. 16, 2016

(86) PCT No.: PCT/KR2016/013193
§ 371 (c)(1),
(2) Date: May 15, 2018

(87) PCT Pub. No.: WO2017/086688
PCT Pub. Date: May 26, 2017

(65) Prior Publication Data
US 2020/0253098 A1  Aug. 6, 2020

(30) Foreign Application Priority Data
Nov. 16, 2015 (KR) .......... 10-2015-0160592

(51) Int. Cl.
*H05K 9/00* (2006.01)
*H02J 50/12* (2016.01)
(Continued)

(52) U.S. Cl.
CPC .......... *H05K 9/0075* (2013.01); *C04B 35/03* (2013.01); *C04B 35/26* (2013.01); *H01F 1/37* (2013.01);
(Continued)

(58) Field of Classification Search
None
See application file for complete search history.

(56) References Cited

U.S. PATENT DOCUMENTS 6,338,900 B1 * 1/2002 Tada .................. H01F 1/37
148/306
6,440,323 B1 * 8/2002 Kobayashi ......... C01G 49/009
252/62.59
(Continued)

FOREIGN PATENT DOCUMENTS

CN    108141994 A    6/2018
JP    H 07-231586 A  8/1995
(Continued)

OTHER PUBLICATIONS

Machine Translation of JP 2007-295557 A (Year: 2007).*
(Continued)

*Primary Examiner* — Kevin M Bernatz
(74) *Attorney, Agent, or Firm* — Daly Crowley Mofford & Durkee, LLP (57) ABSTRACT

Disclosed is a magnetic field shielding unit for wireless power transmission. The magnetic field shielding unit for wireless power transmission includes a magnetic shielding layer formed of ferrite fragments containing magnesium oxide (MgO) shredded to improve flexibility of the magnetic field shielding unit. The ferrite containing magnesium oxide has a real part ($\mu'$) of the complex permeability of 650 or more at a frequency of 100 kHz. Accordingly, it is possible to prevent influence of a magnetic field on components of a
(Continued)

mobile terminal device or a body of a user who uses the same, and to further increase the characteristics of the combined antennas even if the magnetic field shielding unit is combined with various kinds and purposes of antennas having various structures, shapes, sizes and intrinsic characteristics (inductance, resistivity, etc.).

14 Claims, 6 Drawing Sheets

(51) Int. Cl.
    *H02J 50/70*     (2016.01)
    *H01F 27/36*     (2006.01)
    *H01Q 1/22*     (2006.01)
    *H01Q 1/52*     (2006.01)
    *H01F 1/37*     (2006.01)
    *H01F 27/255*     (2006.01)
    *C04B 35/03*     (2006.01)
    *C04B 35/26*     (2006.01)
    *H01F 38/14*     (2006.01)

(52) U.S. Cl.
    CPC ............ *H01F 27/255* (2013.01); *H01F 27/36* (2013.01); *H01F 27/366* (2020.08); *H01F 38/14* (2013.01); *H01Q 1/2208* (2013.01); *H01Q 1/526* (2013.01); *H02J 50/12* (2016.02); *H02J 50/70* (2016.02)

(56) References Cited

U.S. PATENT DOCUMENTS

| | | | | |
|---|---|---|---|---|
| 10,327,365 | B2* | 6/2019 | Jang | ......................... H01F 1/26 |
| 10,930,418 | B2* | 2/2021 | Lee | ........................ H01Q 21/30 |
| 2002/0097127 | A1* | 7/2002 | Fujiwara | ............... H01F 29/146 |
| | | | | 336/178 |
| 2004/0113742 | A1* | 6/2004 | Tanaka | .................... H01F 17/06 |
| | | | | 336/221 |
| 2012/0062435 | A1* | 3/2012 | Kato | ........................ H01Q 7/06 |
| | | | | 343/787 |

FOREIGN PATENT DOCUMENTS

| | | | |
|---|---|---|---|
| JP | 09263442 | A * | 10/1997 |
| JP | 10-229007 | A | 8/1998 |
| JP | 2002-104873 | A | 4/2002 |
| JP | 2005-110412 | A | 4/2005 |
| JP | 2007-067994 | A | 3/2007 |
| JP | 2007-123575 | A | 5/2007 |
| JP | 2007-295557 | A | 11/2007 |
| JP | 2010-147420 | A | 7/2010 |
| JP | 2011-147513 | A | 8/2011 |
| JP | 2011-211337 | A | 10/2011 |
| KR | 10-1534542 | B1 | 7/2015 |
| KR | 10-2015-0125812 | A | 11/2015 |

OTHER PUBLICATIONS

NPL internet page titled Inductors—Permeability (Year: 2021).*
Abstract Translation of JP 09-263442 A (Year: 1997).*
International Search Report dated Feb. 20, 2017 for International Application No. PCT/KR2016/013193; 4 Pages.
Kyoritsu Shuppan Co., Ltd., "*Basics of Magnetic Engineering II—Application of Magnetism* (*in Japanese*)" Section from Chapter 7 "Magnetization Process", Section 7.3 "Alternating-Current Magnetization and High-Frequency Loss;" 1st Edition, $6^{th}$ Printing; Jan. 15, 1981; pp. 304-309; 4 Pages.
Roy et al., "Effect of Mg Substitution on Electromagnetic Properties of $(Ni_{0.25}Cu_{0.20}Zn_{0.55})$ $Fe_2O_4$ Ferrite Prepared by Auto Combustion Method;" Journal of Magnetism and Magnetic Materials, vol. 298, Issue 1; Mar. 2006; pp. 38-42; 5 Pages.
Japanese Office Action (with Machine English Translation) dated Jul. 21, 2020 for Japanese Application No. 2018-525663; 14 Pages.

* cited by examiner

MAGNETIC SHIELDING UNIT FOR WIRELESS POWER TRANSMISSION AND WIRELESS POWER TRANSMISSION MODULE INCLUDING SAME

CROSS-REFERENCE TO RELATED APPLICATION

This application is a U.S. National Stage of PCT/KR2016/013193 filed in the Korean language on Nov. 16, 2016, entitled: "MAGNETIC SHIELDING UNIT FOR WIRELESS POWER TRANSMISSION AND WIRELESS POWER TRANSMISSION MODULE INCLUDING SAME" which application claims priority to Korean Application No. 10-2015-0160592 filed on Nov. 16, 2015, which applications are each hereby incorporated herein by reference in their entireties.

PARTIES TO A JOINT RESEARCH AGREEMENT

The presently claimed invention was made by or on behalf of the below listed parties to a joint research agreement. The joint research agreement was in effect on or before the date the claimed invention was made, and the claimed invention was part of the joint research agreement and made as a result of activities undertaken within the scope of the join research agreement. The parties to the joint research agreement are AMOTECH CO., LTD. and AMOSENSE CO., LTD.

BACKGROUND

1. Technical Field

The present disclosure relates to a magnetic field shielding unit, and more particularly, to the magnetic field shielding unit for a wireless power transmission and a wireless power transmission module including the same.

2. Discussion of the Related Art

Generally, an antenna is a device that converts an electric signal into a radio wave signal and classified into a dielectric antenna using dielectric characteristics and a magnetic antenna using magnetic properties. All antennas may be used in various application fields, and their efficiency depends on their shapes and structures. Conventionally, researches on dielectric antennas using high permittivity materials were actively conducted. Now, with the use of higher frequencies, the problem of performance degradation of antennas due to miniaturization has emerged. Studies on magnetic materials having high magnetic permeability are actively conducted for the high-permittivity materials.

In addition, recently, researches on wireless power transmission in which a battery built in a portable device is charged wirelessly or an electronic device is driven wirelessly are actively studied. The wireless power transmission is performed by transmitting and receiving an electromagnetic wave signal between a wireless power receiving module built in the device and a wireless power transmitting module supplying power to the wireless power receiving module.

The electromagnetic wave signals are not only present between the transmitting module and receiving module but also leaked to the surrounding. Leaked electromagnetic wave may make problems such as a reduction of the transmission/reception efficiency, a shorten transmission/reception distances, and an adverse affectation for users using other components and devices disposed around the module.

To solve these problems, a magnetic field shielding material may be provided in the module to shield the other parts in the device from the magnetic field. In addition, the magnetic field shielding material induces the concentration of the magnetic field between the transmitting and receiving parts, thereby improving the transmission and reception and preventing the deterioration of functions of other parts due to the magnetic field.

The higher the magnetic permeability of the magnetic field shielding material, the better the transmission/reception efficiency. The magnetic permeability varies depending on the type of the magnetic body included in the magnetic field shielding material. In general, magnetic body of any specific composition may exhibit different permeability characteristics depending on the manufacturing process such as sintering temperature, etc., and have a tendency with a large fluctuation width in permeability for each frequency band. Therefore, for improving the performance of the antenna provided in the transmission/reception module having the specific frequency band as an operating frequency, it is advantageous to use the magnetic field shielding material having an excellent magnetic permeability characteristic in the specific frequency band.

However, since the known ferrite has a low magnetic permeability and a high loss magnetic permeability in a low operating frequency band for wireless power transmission, it is difficult to exhibit a magnetic shielding effect at a desired level when known ferrite is applied as a magnetic body for shielding a magnetic field in a frequency band ranging from several tens to several hundreds kHz, which is suitable for wireless power transmission. In addition, the known ferrite has a problem of lowering the wireless power transmission efficiency and shortening the wireless power transmission distance. Further, in the case of a shielding member using the known ferrite as a magnetic material, it is difficult to maintain a uniform plate shape such that the molded body is twisted due to low mechanical strength and high temperature sintering of the magnetic body itself.

SUMMARY

To solve the above problem and defects, it is an object of the present disclosure to provide a magnetic field shielding unit for wireless power transmission that can exhibits excellent magnetic characteristics in the operating frequency band for wireless power signal transmission to improve the wireless power transmission efficiency and extend the transmission distance of the wireless power signal.

It is another object of the present disclosure to provide a magnetic field shielding unit for wireless power transmission having a ferrite magnetic body which has characteristics of an excellent magnetic shielding, a high mechanical strength, a low temperature sintering and a prevention of twisting.

Furthermore, it is still another object of the present disclosure to provide the wireless power transmission module capable of significantly increasing the transmission/reception efficiency and extending transmission/reception distance of wireless power signal through the magnetic field shielding unit, even if various kinds of antennas having various structures, shapes, sizes and intrinsic characteristics (for example, inductance, resistivity, and the like) are integrated.

Furthermore, it is still another object of the present disclosure to provide an electronic device capable of directly driving a portable device, a home appliance, a medical device or the like or charging a built-in battery thereof to indirectly drive, without power line through the wireless power transmission module.

Furthermore, it is still another object of the present disclosure to provide a transportation means such as a car, a train, a ship and a subway capable of wirelessly charging and/or wirelessly driving a portable device such as a smart phone by using the wireless power transmission module during moving.

According to an aspect of the present disclosure, there is provided a magnetic field shielding unit for wireless power transmission that includes a magnetic field shielding layer including ferrite containing magnesium oxide (MgO). The ferrite containing magnesium oxide has a real part ($\mu'$) of complex permeability of 650 or more at a frequency of 100 kHz.

In an embodiment of the present disclosure, the magnetic field shielding unit may further include a protective member disposed on one surface of the magnetic field shielding layer and a first adhesive member disposed on the other surface of the magnetic field shielding layer.

In an embodiment of the present disclosure, the ferrite containing magnesium oxide may have a real part ($\mu'$) of the complex permeability of 650 or more at a frequency of 200 kHz.

In an embodiment of the present disclosure, the ferrite containing magnesium oxide may have an imaginary part ($\mu''$) of the complex permeability of 50 or less at a frequency of 100 kHz.

In an embodiment of the present disclosure, the ferrite containing magnesium oxide may have an imaginary part ($\mu''$) of the complex permeability of 50 or less at a frequency of 200 kHz.

In an embodiment of the present disclosure, the ferrite may include a magnesium oxide of 3 mol % to 12 mol %, and further include a copper oxide of 8 mol % to 14 mol %, a nickel oxide and a zinc oxide. The contents of the nickel oxide and the zinc oxide may be the values such that a ratio calculated by following equation 1 is 3.6 or more.

Content of the zinc oxide in the ferrite (mol %)/Content of the nickel oxide in the ferrite (mol %) [Equation 1]

In an embodiment of the present disclosure, the ferrite may include a magnesium oxide of 3 mol % to 12 mol % and an iron oxide of 46 to 52 weight %, further include a copper oxide 8 mol % to 14 mol %, a nickel oxide of 1 mol % to 10 mol %, and a zinc oxide of 25 mol % to 32 mol %.

In an embodiment of the present disclosure, the magnetic field shield layer may be formed of ferrite fragments in which ferrite containing magnesium oxide is shredded to improve the flexibility of the magnetic field shielding unit.

In an embodiment of the present disclosure, the ferrite fragments may include the 30% or more fragments having a shape ratio of 8.0 or less according to the following equation 2.

Shape ratio=Diameter of circumscribed circle of a fragment ($\mu$m)/Diameter of inscribed circle of a fragment ($\mu$m) [Equation 2]

In embodiments of the present disclosure, the ferrite containing magnesium oxide may have a real part ($\mu'$) of a complex permeability of 1000 or more at a frequency of 100 kHz.

In embodiments of the present disclosure, the average thickness of the magnetic field shielding layer may be 30 $\mu$m to 1 cm.

According to an aspect of the present disclosure, there is provided a wireless power transmission module that includes an antenna unit having a wireless power transmission antenna; and a magnetic field shielding unit for the wireless power transmission according to the present disclosure, disposed on one surface of the antenna unit to improve characteristics of the antenna and condense a magnetic field toward the antenna.

According to an aspect of the present disclosure, there is provided various electronic devices such as home appliances including the wireless power transmission module.

In embodiments of the present disclosure, the home appliance may be at least one selected from the group consisting of a refrigerator, an induction, a gas range, a vacuum cleaner, a speaker, a blender, and a television.

In embodiments of the present disclosure, the wireless power transmission module may include a transmission module or a reception module.

In embodiments of the present disclosure, the present disclosure may provide a transportation means including a wireless power transmission module as a transmission module.

The magnetic shielding unit according to the present disclosure can improve the wireless power transmission efficiency and extend the transmission distance of the wireless power signal as it exhibits excellent magnetic characteristics in the operating frequency band for transmission of the wireless power signal. The ferrite magnetic body may have excellent in magnetic property, high in mechanical strength and can be sintered at a low temperature so that it is prevented from being twisted and has excellent smoothness, which is very advantageous for mounting an antenna as a magnetic field shielding unit The magnetic field shielding unit can improve the wireless power transmission/reception efficiency and extend the transmission distance of the wireless power signal, even if various kinds of antennas having various structures, shapes, sizes and intrinsic characteristics (for example, inductance, resistivity, and the like) are integrated.

Furthermore, the electronic device can directly drive the portable device, the home appliance, the medical device or the like or charge the built-in battery thereof to indirectly drive, without power line. Accordingly, the electronic device having positional restriction about outlet location or the like can be implemented as a wireless type In addition, the wireless power transmission module can wirelessly charge and/or drive the portable device such as a smart phone during moving in the transportation means, thus can provide great convenience.

BRIEF DESCRIPTION OF THE DRAWINGS

FIG. 6 and FIG. 7 are schematic views illustrating a manufacturing process using a shredding device used for manufacturing a magnetic field shielding unit according to an embodiment of the present disclosure. In detail.

DETAILED DESCRIPTION OF THE EMBODIMENTS

Hereinafter, exemplary embodiments of the present disclosure will be described in detail with reference to the accompanying drawings, which will be readily apparent to those skilled in the art to which the present disclosure pertains. The present disclosure may be embodied in many different forms and is not limited to the embodiments described herein. In the drawings, parts not relating to the description are omitted for clarifying the present disclosure, and the same reference numerals are assigned to the same or similar components throughout the specification.

The term 'for wireless power transmission' as used throughout this specification is meant to include all uses for the transmission and reception of wireless power.

In addition, 'ferrite' described throughout the present specification refers to a sintered body obtained by sintering a molded product containing at least one of a ferrite powder and ferrite granules obtained by mixing an organic material, or a plate-type sintered body formed by applying a slurry containing a ferrite powder and an organic material on a film, followed by drying and sintering.

Figure 1:
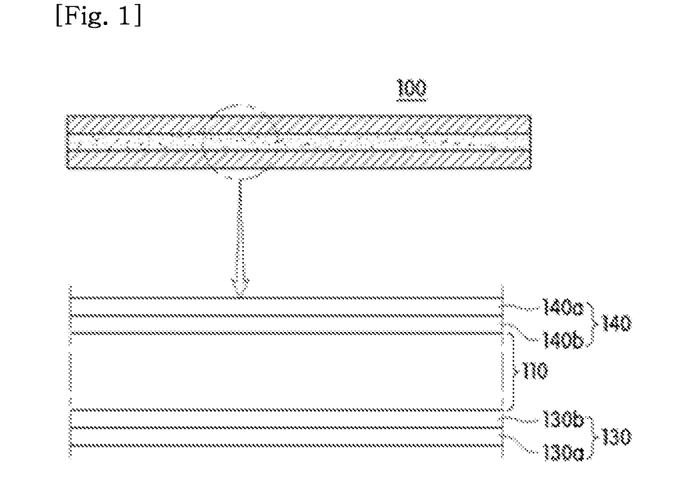
FIG. 1 is a sectional view of a magnetic field shielding unit for wireless power transmission according to an embodiment of the present disclosure.

As shown in FIG. 1, the magnetic field shielding unit 100 for wireless power transmission according to an embodiment of the present disclosure may include a magnetic field shielding layer 110. The magnetic field shielding layer 110 may be formed of ferrite containing magnesium oxide. The magnetic field shielding unit 100 may further include a protection member 140 disposed on top surface of the magnetic field shielding layer 110 and a first adhesive member 130 disposed on the bottom surface of the magnetic field shielding layer 110. The first adhesive member 130 may include a first adhesive layer 130b and a releasing film 130a for protecting the first adhesive layer 130b until the magnetic shielding unit 100 is attached to the adhered. However, the protective member 140 and/or the first adhesive member 130, which may further be provided on upper or/lower portion of the magnetic shielding layer, may be applied differently depending on the product to be implemented. Accordingly, the magnetic field shielding unit 100 can be implemented only with the magnetic field shielding layer 110 without the first adhesive member 130 and the protective member 140. A layer for another function other than the first adhesive member 130 and the protective member 140 may be further laminated on the magnetic field shielding layer. An insulating film, for example, coating film for other functions may be further provided on at least one side of the magnetic field shielding layer to further generate and/or condense a magnetic flux in a specific direction.

Meanwhile, the magnetic field shielding layer 110 according to the present disclosure may include the ferrite containing magnesium oxide as the magnetic material. The ferrite containing magnesium oxide may play a role of increasing the real part of the complex permeability and minimizing variance (maintaining or increasing) of the imaginary part. The magnetic field shielding layer 110 may exhibit a magnetic field shielding property and a heat radiation property at the same time and may have excellent in mechanical strength. There is an advantage that the magnetic field shielding layer may not be easily magnetized by the permanent magnet which is provided in the transmitting unit for aligning the magnetic field between the transmitting and receiving antennas. The ferrite produced by sintering at a low temperature, compared to the ferrite produced by high-temperature sintering, has a fine structure of the ferrite which is dense and uniform. Thus, an excellent permeability can be achieved. Further, the problem that the ferrite sheet is bent, which is problematic in the production of the ferrite which is sintered at high temperature, does not occur. The ferrite manufactured by low temperature sintering has almost no change in its shape after sintering and is superior to the high temperature sintered ferrite in applications In addition, the ferrite containing magnesium oxide included in one embodiment of the present disclosure may exhibit excellent magnetic characteristics at an operating frequency used for a magnetic security transmission and/or a short distance communication. Therefore, the ferrite containing magnesium oxide can remarkably improve efficiency and distance range of the transmission/reception of the signal. Since the ferrite containing magnesium oxide may not need to be integrated with the heterogeneous magnetic materials for the exertion of all functions, it may be well suited for implementing slimmed shielding units, modules, and portable devices.

When the ferrite containing magnesium oxide is capable of exhibiting permeability properties of a magnetic field shielding unit described below in a fragmented state, there is no limitation on composition, crystal type, and microstructure of sintered particles. However, preferably, the crystal structure of ferrite containing magnesium oxide may be spinal type. In addition, the ferrite containing magnesium oxide may preferably include 3 mol % to 12 mol % of magnesium oxide. If the content of magnesium oxide is less than 3 mol %, the real part of the complex permeability is negligibly increased, so that the magnetic security transmission efficiency may not be improved. Thus, it may be difficult to satisfy all the desired physical properties. Further, if the content of magnesium oxide in the ferrite is more than 12 mol %, the saturation magnetic density may be lowered, the imaginary part of the complex permeability may increase at a greater rate than the real part of the complex permeability, and the temperature coefficient may be undesired value.

The ferrite may include 46 mol % to 52 mol % of iron trioxide. If the content of iron trioxide in the ferrite is more than 52 mol %, the contents of magnesium oxide, copper oxide, zinc oxide and nickel oxide, which will be described later, may be reduced, so that the desired level of magnetic properties by each component may not be exhibited. In addition, if the content of iron trioxide in ferrite is less than 46 mol %, the desired level of magnetic properties may not be exhibited.

In addition, the ferrite according to one embodiment of the present disclosure may further include copper oxide of 8 mol % to 14 mol %. The copper oxide may serve to lower the sintering temperature and grow the crystal grains. If the content of copper oxide in the ferrite is less than 8 mol %, the real part of the complex permeability may decrease at least one of the frequency bands used by the desired the wireless power transmission. If the content of copper oxide in the ferrite is included more than 14 mol %, the grain growth during sintering may not be normal and the imaginary part of the complex permeability may be remarkably increased.

On the other hand, the value of the nickel oxide and zinc oxide may be 3.6 or more, and more preferably 12 or less according to the following equation 1.

Content of zinc oxide in ferrite (mol %)/Content of nickel oxide in ferrite (mol %)  [Equation 1]

If the value calculated using Equation 1 is less than 3.6, the imaginary part of the complex permeability may be lowered at a frequency of 100 kHz to 300 kHz, more preferably of 100 kHz to 200 kHz. However, the real part of the complex permeability may be greatly deteriorated and the desired level of physical properties may not be exhibited.

The ferrite may further include zinc oxide of 25 mol % to 32 mol % and nickel oxide of 1 mol % to 10 mol %. If the content of nickel oxide in the ferrite is less than 1 mol %, the real part of complex permeability at 100 kHz frequency may be lowered. In particular, the resonance frequency of the complex permeability may shift to the low frequency side, and the real part of the complex permeability may decrease at the frequency of the short distance communication. As the imaginary part of the complex permeability is significantly increased, the efficiency of the short distance communication may be significantly lowered, so that it may be impossible to simultaneously improve several functions such as the short distance communication with a single magnetic shielding unit. When the content of nickel oxide in the ferrite is more than 10 mol %, the real part of the complex permeability may decrease considerably over the low-frequency band and the high-frequency band, and the transmission/reception efficiency and distance of wireless power transmission may not be simultaneously improved. In addition, the resistance of the ferrite may be reduced and magnetic loss and heat generation due to eddy currents may occur.

When the content of nickel oxide in the ferrite is less than 25 mol %, the real part of the complex permeability may decrease in the operating frequency band used for the wireless power transmission, so that the characteristics of the wireless power transmission antenna may not be improved. If the content of nickel oxide in the ferrite is more than 32 mol %, the imaginary part of the complex permeability significantly may increase in the operating frequency band used for the wireless power transmission. In addition, magnetic loss and heat generation due to eddy currents may occur.

The ferrite according to an embodiment of the present disclosure may include iron trioxide of 47 mol % to 51 mol %, nickel oxide of 3 mol % to 8 mol %, zinc oxide of 26 mol % to 30 mol %, copper oxide of 9 mol % to 12 mol %, and magnesium oxide of 6 mol % to 11 mol %. These compositions may be more advantageous to manifest all desired properties. On the other hand, compositions and ratio of the compositions of the ferrite containing magnesium oxide may not be limited thereto, and may be changed according to the degree of desired physical properties.

The thickness of the magnetic shielding layer 110 may be a thickness of the ferrite sheet derived from the ferrite fragments containing magnesium oxide 111, and may be 30 μm to 1 cm. If the average thickness is less than 30 μm, the magnetic properties may not be obtained to the desired level. If the average thickness is more than 1 cm it may be hard to get the slimness of shielding unit. It is difficult to use due to an increase in the weight of the applied product, and cracking may occur in the ferrite sintering process. The thickness of the magnetic shielding layer 110 may be designed in consideration of the type of the applied product and the degree of magnetic characteristics to be developed. For example, when the magnetic shielding layer 110 is applied to a robot cleaner, the thickness of the magnetic shielding layer 110 may be 5 mm to 10 mm.

In addition, the magnetic field shielding layer may be formed in a shape a polygon such as a pentagon, a circle, an ellipse, or a shape in which a curve and a line are partially mixed, as well as a tetragon such as a rectangle or a square. The shape of the magnetic field shielding layer may correspond to a shape of an application to which the magnetic field shielding unit is applied for wireless power transmission antenna. At this time, the size of the magnetic field shielding unit may be preferably about 1 mm to 2 mm larger than the antenna size of the corresponding module.

Figure 2:
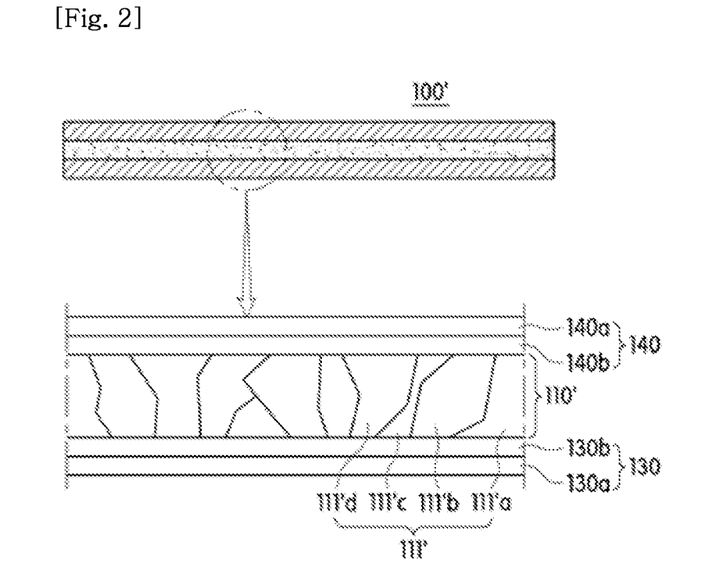
FIG. 2 is a sectional view of a magnetic field shielding unit for wireless power transmission according to another embodiment of the present disclosure.

As shown in FIG. 2, the magnetic field shielding layer 110' may include ferrite fragments 111' which may be formed by shredding a ferrite sheet containing magnesium oxide to improve the flexibility of the magnetic field shielding unit.

The slimness and thinness of the magnetic field shielding unit may be required depending on the type and specification of the product to be applied. When physical influences are continuously applied to the magnetic field shielding unit due to frequent vibration or shocks on the product, there is a case where the adhesion of the magnetic field shielding unit on the sheet is lowered due to the presence of a step on the part to be attached and/or mounted.

In order to make the magnetic field shielding unit slimmer and thinner, thin magnetic body may be advantageous. The ferrite containing magnesium oxide may be easily broken. When the thickness of the ferrite sheet is thin, the ferrite sheet may be cracked even by a weak external force. Therefore, having been cracked, the ferrite sheet may have changed the magnetic properties such as the magnetic permeability compared to those prior to being cracked. If the fine fragmentation of the ferrite sheet is intensified, its magnetic property is remarkably deteriorated, so that its initial set values of the physical properties may not be maintained.

In addition, the magnetic field shielding unit having a thin ferrite structure is required to be handled to prevent cracking, when it is stored, transported, and put into the assembly process, but such handling may significantly reduce workability. Specifically, the magnetic field shielding unit may be disposed on the surface on which the antenna is formed, and may be adhered to the surface on which the antenna is formed in order to improve the antenna characteristics and to prevent the magnetic field shielding unit from escaping. Referring to FIG. 2, the magnetic field shielding unit 100 may be attached to a surface to be adhered (not shown) through the first adhesive member 130. To this end, the removal of the releasing film 130a for protecting the first adhesive layer 130b of the first adhesive member 130 may be preceded. However, in order to remove the releasing film 130a from the magnetic field shielding unit 100', an external force may be required with equal to or higher than a certain level. When the thickness of the ferrite sheet is very thin, the ferrite sheet may be easily cracked even by an external force for removing the releasing film 130a. Therefore, even when peeling off the releasing film 130a, a large amount of work load may be applied to this job and it cause to a lower workability. In addition, even when a portable device is manufactured with great efforts to prevent cracks from occurring in the ferrite sheet, the ferrite sheet may be cracked or broken by an impact due to dropping of the portable device during using. Therefore, there is a problem in that it may not guarantee transmission/reception efficiency and transmission/reception distance range of a desired level wireless power signals.

Also, even when the thickness of the magnetic field shielding layer is thick, the crack or brokenness may occur due to an external force applied depending on the shape of the magnetic field shielding layer. The generated cracks or brokenness may cause the initially set magnetic characteristics to fluctuate and prevent the desired level of performance of the wireless power transmission.

In addition, in the case where a step is present on a part attached to and/or mounted on the product, there exists a region where the magnetic field shielding layer is not adhered unless the magnetic field shielding layer is formed in accordance with the portion, which causes deterioration of the wireless power transmission performance. In this case, since the ferrite must be manufactured by individually forming the ferrite according to the shape of the part to be applied to the product, the product cost may increase.

However, the magnetic field shielding unit 100' according to one embodiment of the present disclosure may be remarkably improved in flexibility. The reason is that the ferrite containing magnesium oxide, which is magnetic material, is provided in shredded and fragmented state at the beginning. Even if the thickness of the magnetic field shielding unit is thinned, the risk that cracks may be further generated in the ferrite fragments due to the external force can be blocked at its source. In addition, the ferrite may be provided in the magnetic field shielding unit in the fragmented state, and its physical properties may be designed such that the magnetic field shielding unit including the ferrite in the fragmented state may exhibit excellent characteristics in the wireless power transmission. Since the initial physical property value may be continuously maintained in the manufacturing stage of the finished product to which the magnetic field shielding unit is installed and in the using stage of the finished product, it may be possible to fundamentally eliminate deterioration of the physical property due to the deterioration caused by unintentional fragmentation occurring in the magnetic field shielding unit 100 having the ordinary non-shredded magnetic material as shown in FIG. 1 and as a result of this, significant reduction in the performance of power signal transmission and reception.

Figure 3:
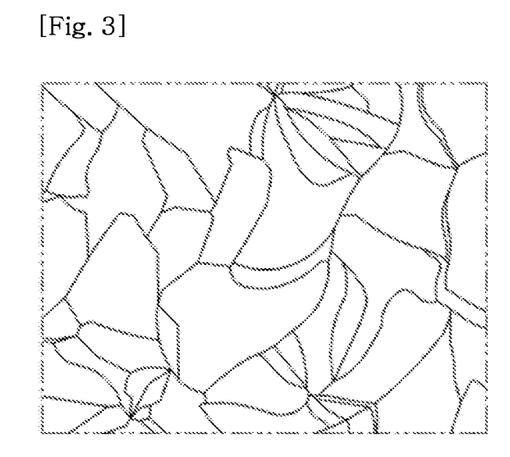
FIG. 3 is a schematic view showing shapes of ferrite fragments observed on one surface of a magnetic field shielding layer including the ferrite fragments in a magnetic shielding unit according to an embodiment of the present disclosure.

On the other hand, the ferrite fragments containing magnesium oxide 111' may have irregular shapes. However, the gap between fragments may cause a magnetic leakage and thus result in deterioration of physical properties. Therefore, it is beneficial to ensure that there are no gaps between the fragments. In this case, unintended ferrite fragmentation may occur during the shielding unit warping or bending. In this case, the physical properties may fluctuate or deteriorate. In order to prevent this, shredding of the ferrite sheet may be performed such that at least one side of a part of the fragments may have a curved shape (refer to FIG. 3). Further, if the magnetic field shielding layer includes the ferrite fragments of which one side is curved, collision or friction between adjacent fragments can be reduced when the magnetic field shielding unit is bent. There is an advantage that additional fine fragmentation may be prevented even when an external force is applied to the magnetic field shielding unit.

More preferably, the number of the fragments having at least one curved shape may be 45% or more, and further preferably, 60% or more of the total number of fragments in the magnetic field shield layer. If the number of fragments having at least one curved shape is less than 45% of the total number of fragments, the magnetic field shielding layer including the fragments having such a shape may decrease flexibility. Additional fragmentation may be caused by an external impact, which may result in deterioration of properties such as reduction of permeability of the magnetic field shielding unit.

In addition, the average diameter of the ferrite fragments containing magnesium oxide 111' may be 100 to 2000 μm. If the average diameter exceeds 2,000 μm, additional fracture of the fragments and generation of fragments may be increased, and thus it may be difficult to maintain the initial designed physical properties of the magnetic field shielding unit. If the average diameter of the fragments is less than 100 μm, it is necessary to select a ferrite having a remarkably high magnetic property value such as magnetic permeability before performing the shredding. However, as there is a limitation of manufacturing the ferrite having high permeability, it is difficult to design the initial properties of the magnetic field shielding unit to the desired level. On the other hand, the average diameter of the fragments may be a result measured based on the volumetric average diameter measured by a laser diffraction grain size distribution meter.

In order to prevent further breakage and fragmentation of the ferrite fragments, the ferrite fragments containing magnesium oxide 111' may preferably include 30% or more fragments having a shape ratio of 8.0 or less on one side of the fragments according to the following equation.

$$\text{Shape ratio} = \text{Diameter of circumscribed circle of a fragment (μm)} / \text{Diameter of inscribed circle of a fragment (μm)} \quad \text{[Equation 2]}$$

Figure 4:
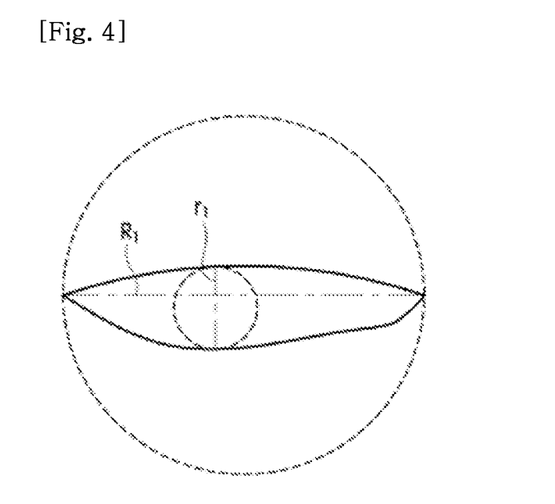
FIGS. 4 and 5 are diagrams showing diameters of the circumscribed circle and the inscribed circle of the fragments for evaluating the shape ratio of the ferrite fragments having irregular shapes.

In Equation 2, the diameter of circumscribed circle of the fragment may mean the longest distance between any two points on one side of the fragment ($R_1$ in FIG. 3 and $R_2$ in FIG. 4), and a circle passing through two points of the fragment farthest from each other is the circumscribed circle of the fragment. The diameter of the inscribed circle of the fragment may mean the diameter of the inscribed circle having the largest diameter among the inscribed circles in contact with at least two sides present on any one side of the fragment ($r_1$ in FIG. 3, $r_2$ in FIG. 4). The large shape ratio of one side of the fragments means that the shape of the one side of the fragments is long (refer to FIG. 3) or sharp (refer to FIG. 4). This means that additional breakage, and fragmentation the fragments may occur.

Accordingly, it is preferable that the number of the fragments having a large shape ratio among the ferrite fragments containing magnesium oxide 111' included in the magnetic field shielding layer 110' is less than a predetermined ratio. Accordingly, among all the fragments in the magnetic field shielding layer 110' the fragments having the shape ratio of 8.0 or less according to Equation 2 may be included 30% or more, more preferably 45% or more, further preferably 60% or more. If the fragments having the shape ratio of 8.0 or more among all the fragments in the magnetic field shielding layer 110 are less than 30%, the additional fine fragmentation of the ferrite fragments may occur, which may cause a significant deterioration of physical properties such as permeability, and may not maintain the desired initial designed values of physical property.

In the case of the shredding device (refer to FIGS. 6 and 7), the curved shape and the shape ratio of the shredded fragments may be adjusted by an interval between unevenness, a shape of the unevenness, and the like.

Meanwhile, the magnetic field shielding units 100 and 100' according to the present disclosure may include ferrite containing magnesium oxide from the beginning to form a magnetic field shielding layer. Nevertheless, the characteristics of antennas for wireless power transmission can be significantly improved. In the bulk state ferrite containing magnesium oxide for condensing the magnetic field toward the antenna, the real part ($\mu'$) of the complex permeability at the frequency of 100 kHz may be 650 or more, preferably 830 or more, and even more preferably 1400 or less. Further, preferably, the imaginary part ($\mu''$) of the complex permeability at the frequency may be 50.0 or less.

If the real part of the complex permeability at the 100 kHz frequency is less than 650, the desired wireless power transmission efficiency may not be achieved and the transmission/reception distance range may be significantly reduced. Further fine fragmentation of the ferrite fragments may fail to satisfy the physical properties required for the wireless power transmission, and it may result in defective products. In addition, when it is intended to simultaneously use the magnetic security transmission as well as the wireless power transmission, the wireless power transmission performance of a desired level may not be exhibited. In addition, when the real part of the complex permeability exceeds 1400, the desired physical properties may not be achieved due to a large increasing of the imaginary part. On the other hand, when the imaginary part of the complex permeability exceeds 50 at the frequency, the transmission efficiency/distance range of the magnetic security data signal and the wireless power signal may not be achieved to a desired level even if the real part of the complex permeability is large.

In order to further improve the characteristics of the wireless power transmission antenna, the ferrite containing magnesium oxide included in the magnetic field shield unit 100 and 100' according to an embodiment of the present disclosure may satisfy a quality index value of 29.0 or more at a frequency of 100 kHz according to following Equation 3.

A quality index value=a real part of complex permeability at a predetermined frequency ($\mu'$)+an imaginary part of complex permeability at a predetermined frequency ($\mu''$)     [Equation 3]

The increasing of the quality index value according to Equation 3 means that the real part of the complex permeability is increased and the imaginary pat of the complex permeability is no change. Alternatively, the real part of the complex permeability is constant and the imaginary part of the complex permeability may be decreased. Alternatively, the real part of the complex permeability is increased and the imaginary part of the complex permeability is decreased at the same time. In any case, the signal transmission/reception efficiency and transmission/reception distance can be increased. If the quality index value is less than 29.0 at a frequency of 100 kHz, the wireless power transmission efficiency may not be achieved at the desired level, and the magnetic security transmission performance may also be not achieved at the desired level.

In case of the ferrite containing magnesium oxide, the real part ($\mu'$) of the complex permeability may be less than 650 at a frequency of 200 kHz and the real part ($\mu'$) of the complex permeability may be 140 to 236 at a frequency of 13.56 MHz. More preferably, the imaginary part ($\mu''$) of the complex permeability may be 50 or less at a frequency of 200 kHz, and the imaginary part ($\mu''$) of the complex permeability may be 400 or less at the frequency of 13.56 MHz. These combination may make it possible to transmit the magnetic security transmission signal, the wireless power transmission signal and the short range communication signal with better efficiency so that the magnetic field shielding unit according to the present disclosure may exert various desired functions at the same time with excellent performance.

Meanwhile, the wireless power transmission may be applied to the Qi scheme, or the wireless power transmission of power matters alliance (PMA) scheme in which a part of the magnetic force lines generated from the permanent magnets are induced through an attractor (not shown). In addition, the present disclosure may be applied to a magnetic resonance method based wireless power transmission in which wireless power transmission is performed at a frequency of several tens kHz to 6.78 MHz.

As shown in FIG. 1 and FIG. 2, the protective member 140 having a base film 140a and a second adhesive layer 140b formed on a surface of the base film 140a may be disposed on the top surface of the magnetic field shielding layer 110 and 110'. The first adhesive member 130 having a releasing film 130a and a first adhesive layer 130b formed on a side of the releasing film 130a may be disposed on the bottom surface of the magnetic field shield layer 110.

First, the base film 140a of the protective member 140 may be the protective film typically provided in the magnetic field shielding unit. The base film 140a needs to have heat resistance sufficient to withstand the heat/pressure applied for hardening in the step of attaching the magnetic field shielding sheet to a substrate having the radiator. In addition, the base film 140a also needs to have mechanical strength and chemical resistance sufficient to protect the magnetic field shielding layer 110 or 110' against external physical and chemical stimuli. Any film which can meet such characteristics may be used without limitation. As non-limiting examples, the raw material of the base film 140a of the protective member 140 may include polyethylene, polypropylene, polyimide, crosslinked polypropylene, nylon, polyurethane resin, acetate, polybenzimidazole, polyimideamide, polyetherimide, polyphenylene sulfide (PPS), polyethylene terephthalate (PET), polytrimethylene terephthalate (PTT), polybutylene terephthalate (PBT), polyvinylidene fluoride (PVDF), polytetrafluoroethylene (PTFE), polychlorotrifluoroethylene (PCTFE), and polyethylene tetrafluoroethylene (ETFE) and the like, which may be used alone or in combination.

The base film 140a may have a thickness of 1 μm to 100 μm, preferably 10 μm to 30 μm, but is not limited thereto.

The protective member 140 may include the second adhesive layer 140b on a surface of the base film 140a. The protective member 140 may be adhered to the magnetic field shielding layer 110 through the second adhesive layer 140b.

The second adhesive layer 140b may be a conventional adhesive layer without limitation and may be a double-sided tape-type adhesive layer formed as a single layer through an adhesive layer forming composition or an adhesive layer forming composition formed on both sides of a supporting film. The thickness of the first adhesive layer 140b may be in the range of 3 μm to 50 μm, but is not limited thereto and may be changed according to the purpose of use.

Next, the first adhesive member 130 may function to attach the magnetic field shielding unit 100 or 100' to the antenna or a substrate provided with the antenna. As shown in FIG. 1, the first adhesive member 130 may include the first adhesive layer 130b for attaching the magnetic field shielding unit 100, or 100' to a surface to be attached and further include the releasing film 130a for protecting the first adhesive layer 130b. A conventionally known releasing film which can be easily removed from the first adhesive layer 130b may be used as the releasing film 130a without limitation, but the present disclosure is not particularly limited thereto.

The first adhesive layer 130b may be formed by applying an adhesive composition to the bottom surface of the magnetic field shielding layer 110 or 110'. The first adhesive layer 130b formed by applying an adhesive composition on the releasing film 130a may be attached to the magnetic field shielding layer 110 or 110'. Alternatively, the first adhesive layer 130b may be a double-sided adhesive member coated with an adhesive agent on both sides of the film-like supporting substrate for reinforcement of mechanical strength. The thickness of the first adhesive layer 130b may be 3 μm to 50 μm, but the present disclosure is not limited thereto and may be modified according to the purpose.

The magnetic field shielding unit 100 or 100' according to an embodiment of the present disclosure may be manufactured by a manufacturing method described below, but the present disclosure may not be limited thereto.

First, the step (a) of preparing a ferrite sheet containing magnesium oxide may be performed. Since the ferrite sheet containing magnesium oxide may be produced by a conventional method producing the ferrite sheet, the present disclosure is not limited thereto. As an example of the manufacturing method, nickel oxide, zinc oxide, copper oxide, magnesium oxide, and iron trioxide may be mixed in a predetermined composition ratio to obtain a raw material mixture. At this time, the mixture may be mixed by dry mixing or wet mixing, and the particle diameter of the raw material to be mixed may be preferably 0.05 μm to 5 μm. The components such as magnesium oxide, nickel oxide, and zinc oxide contained in the raw material mixture may be the component itself or in the form of a composite oxide containing the components.

Next, the raw material mixture is subjected to plasticity to obtain a plastic material. The plasticity may be carried out in order to promote a paralysis of raw material, a homogenization of components, a generation of ferrite, a disappearance of ultrafine powder by sintering, and grain growth to an appropriate degree of particle size, thereby converting the raw material mixture into suitable form for post-processing. The sintering may be preferably carried out at a temperature of 800° C. to 1100° C. for 1 to 3 hours. The preliminary plasticity may be performed in an air atmosphere or an atmosphere having a higher oxygen partial pressure instead the air atmosphere.

Next, the obtained sintered material is grinded to obtain a grinded material. The grinding may be carried out to break lumps of the sintered material to obtain a powder having an appropriate degree of sintering property. When the sintered material is large lumps, a wet grinding using a boll mill, an attritor mill or the like may be carried out after the rough grinding. The wet grinding may be carried out until the average particle diameter of the grinded material becomes preferably about 0.5 μm to 2 μm.

Thereafter, the ferrite sheet containing magnesium oxide may be produced through the obtained grinding material. A known method may be used for producing the ferrite sheet, which is not particularly limited in the present disclosure. As a non-limiting example, the obtained grinding material may be subject to a slurring processing together with additive agents such as a solvent, a binder, a dispersant, and a plasticizer to produce a paste. Using this paste, a ferrite sheet having a thickness of 30 μm to 600 μm may be formed. After the ferrite sheet is processed into a predetermined shape, the ferrite sheet may be produced though a binder removal process and a plastic process. The sintering process may be carried out preferably at a temperature of 900° C. to 1300° C. for 1 to 5 hours. The sintering process may be performed in an air atmosphere or an atmosphere having a higher oxygen partial pressure than the air atmosphere. The sintered body after sintering the produced ferrite sheet may have a density of 5.0 g/cm$^3$ to 5.3 g/cm$^3$.

On the other hand, as another embodiment for producing the ferrite sheet containing magnesium oxide, the ferrite powder and the binder resin may be mixed and then manufactured by a known method such as a powder compression molding method, an injection molding method, a calendar method and an extrusion method, etc.

As shown in FIG. 1, the magnetic field shielding unit 100 may be implemented by providing a protective member 140 on the upper portion and a first adhesive member 130 on the lower portion of the ferrite sheet containing the magnesium oxide.

Next, the step (b) of forming the magnetic field shielding layer formed of ferrite fragments may be carried out by shredding the ferrite sheet including the produced magnesium oxide and prepared for manufacturing the magnetic field shielding unit 100' shown in FIG. 2.

Figure 5:
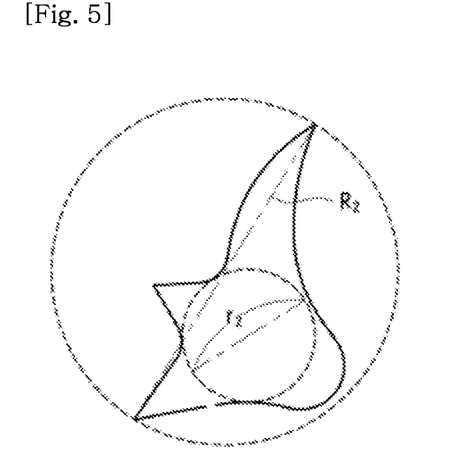

In one embodiment of the step (b), the protective member 140 having the second adhesive layer 140b may be attached to one surface of the ferrite sheet. A lamination body attached the first adhesive member 130 having the first adhesive layer 130b formed on the other surface may be passed through a shredding device so that the ferrite sheet may be sliced into amorphous fragments. Thereafter, a pressure may be applied to the lamination body to adjust the particle size and the degree of deformation of the desired fragments to improve flexibility, thereby preventing further damage, fracture, and fine-fragmentation of the fragments. In the case of the shredding device as shown in FIG. 5, the particle size and the shape ratio of the shredded fragments may be adjusted by an interval between unevenness, a shape of the unevenness, and the like.

Figure 6:
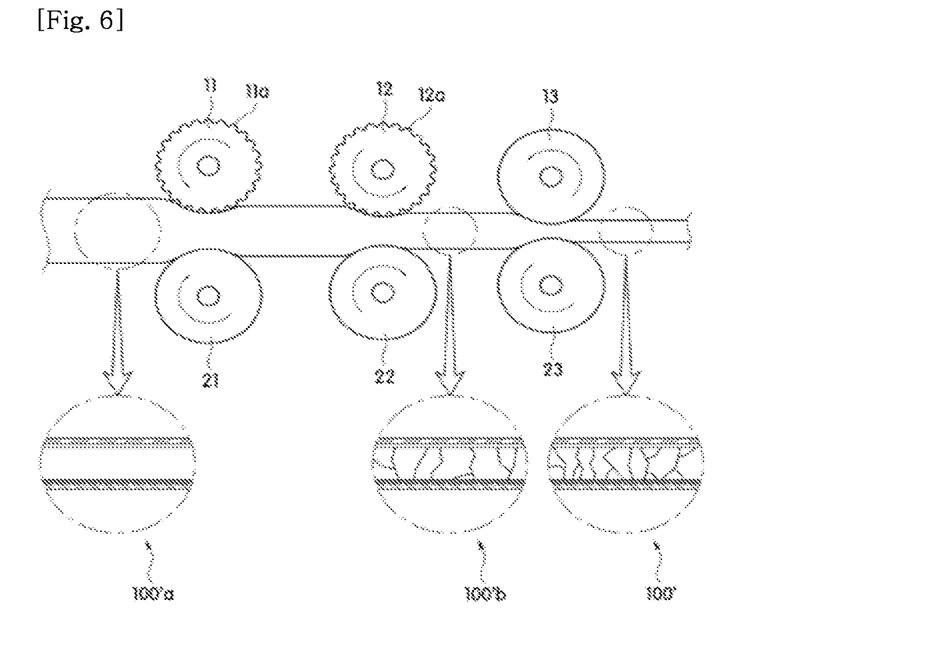
FIG. 6 is a view showing a manufacturing process using the shredding device for shredding a ferrite sheet through unevenness provided on a roller.

Specifically, as shown in FIG. 6, the lamination body 100'a may be passed through the shredding device provided with the first rollers 11 and 12 having the unevenness 11a and 12a and the second rollers 21 and 22 corresponding to the first rollers 11 and 12, respectively. After lamination body 100'a may be shredded, the lamination body 100b may be further broken through the third roller 13 and the fourth roller 23 corresponding to the third roller 13 to form the magnetic field shielding unit 100'.

Figure 7:
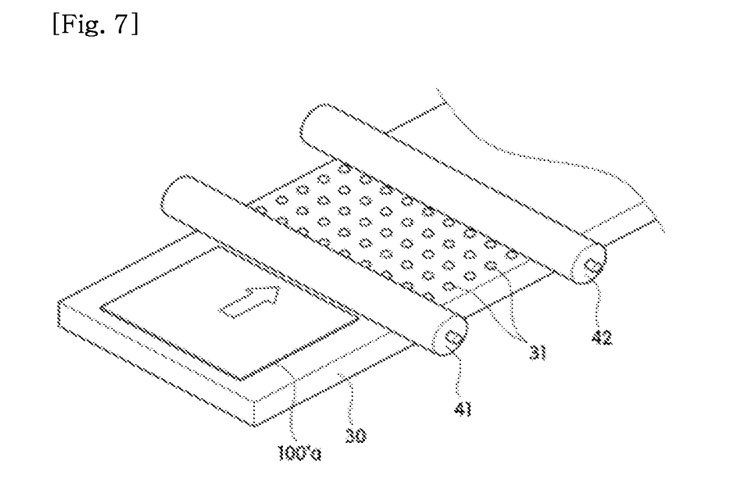
FIG. 7 is a view showing a manufacturing process using the shredding device for shredding the ferrite sheet through metal balls provided on a support plate.

As shown in FIG. 7, the lamination body 100'a including the ferrite sheet may be fed into the shredding device which is provided with a support plate 30 having a plurality of metal balls 31 on one surface thereof and rollers 41 and 42 disposed on the upper portion of the support plate 30 for moving the ferrite sheet to be shredded. Pressure may be applied through the metal ball 31 to shred the ferrite sheet. The shape of the metal ball 31 may be spherical, but is not limited thereto, may be a triangle, a polygon, an ellipse, or the like. The shape of the metal ball 31 formed on the first roller may be one shape or a mixture of various shapes.

Figure 8:
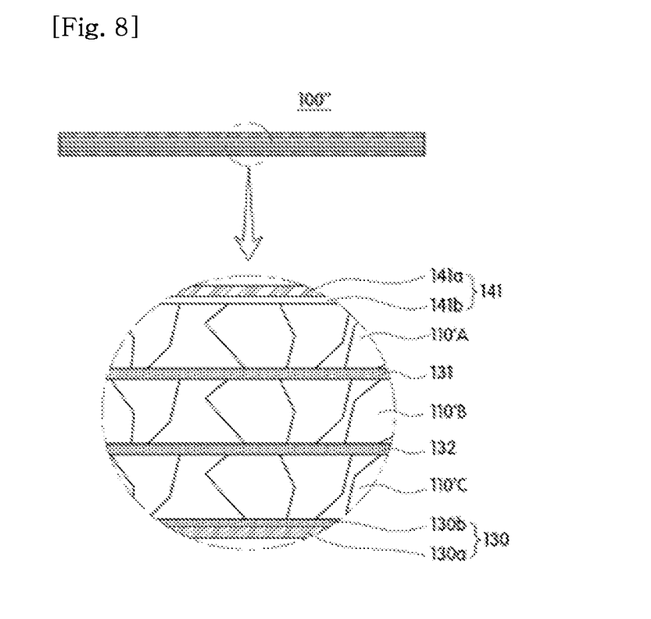
FIG. 8 is a cross-sectional view of a magnetic field shielding unit for wireless power transmission according to an embodiment of present disclosure having a magnetic field shielding layer including three layers formed of the ferrite fragments.

On the other hand, as shown in FIG. 8, the above-mentioned magnetic field shielding layer may be provided in the magnetic-field shielding unit 100″ as a plurality of 110′A, 110′B, and 110′C. The second adhesive members 131 and 132 may be interposed between adjacent magnetic shield layers 110′A/110′B and 110′B/110′C.

It may be difficult to achieve an improved signal transmission and reception efficiency and distance range over a desired level when only a single magnetic field shielding layer is provided according to the specific case in which the magnetic field shielding unit 100″ is applied. That is, a method of increasing the magnetic property of the magnetic field shielding unit itself may include a way of using a magnetic body having excellent physical properties such as permeability at a desired frequency, a way of increasing the thickness of the magnetic field shielding layer, and the like. When the thickness of the ferrite sheet of the single layer is increased to a certain level or more in order to increase the thickness of the magnetic field shielding layer, the surface portion and the inside of the sheet are not uniformly sintered in the sintering process. The magnetic permeability due to non-uniform sintered structure may be decreased. Thus, there is a limit to increase the permeability through the increasing of the thickness of the magnetic field shielding layer of the single layer. Accordingly, it is possible to achieve a high permeability increasing effect by increasing the overall thickness of the magnetic field shielding layer by providing a plurality of the magnetic field shielding layers themselves. The magnetic shielding unit having the laminated magnetic shielding layers may further improve the characteristics of the antennas.

When a plurality of the magnetic field shielding layers 110′A, 110′B, and 110′C are provided in the magnetic field shielding unit 100″, the number of the magnetic field shielding layers may be preferably 2 to 12. However, the present disclosure is not limited thereto. For example, in the case of wireless television, 4 to 8 magnetic field shielding layers of 5 to 10 mm may be stacked on a wireless power transmission module for transmitting the power signal for driving a television. In order to generate and focus the magnetic flux in the longitudinal direction of the magnetic field shielding layer, the magnetic-shielding layer may further include an insulating coating layer on the other surface except for both ends in the longitudinal direction, and the insulating coating layer may be a known insulating coating.

The second adhesive members 131 and 132 may be interposed between adjacent magnetic shielding layers 110A/110B and 110B/110C. The second adhesive members 131 and 132 may function to improve the flexibility of the shielding unit, to prevent further fine fragmentation of fragments, and to prevent oxidation of ferrite fragments due to penetration of moisture. The second adhesive members 131 and 132 may be the same as the first adhesive member described above. That is, the second adhesive member may be a double-sided adhesive member coated with an adhesive composition on both sides of the supporting substrate. That is, the second adhesive member may be formed by applying the adhesive composition to the one magnetic field shielding layer without the supporting substrate for thinning the shielding unit, and stacking another magnetic field shielding layer on the one shielding layer.

In another embodiment, the second adhesive members 131 and 132 may be a heat-radiating adhesive layer. The heat-radiating adhesive layer may be formed by mixing a known heat radiating filler such as nickel, silver, or carbon with an adhesive component such as acrylic, urethane, epoxy or the like. Since the specific composition and content may be determined according to known composition and content, it is not particularly limited in the present disclosure.

When a plurality of the magnetic field shielding layers 110′A, 110′B, and 110′C are provided, the composition of the ferrite included in the respective magnetic field shielding layer may be the same or different from each other. Also, even though the composition is the same, the magnetic shielding layers may have different magnetic permeability due to the difference in the heat treatment time and the like. The thickness of each of the magnetic field shielding layers may be the same or different from each other depending on the purpose.

Meanwhile, although FIG. 8 shows a case where the magnetic field shielding layer is formed of fragmented ferrite, the present disclosure is not limited thereto. The magnetic shielding unit may be implemented by a plurality of magnetic field shielding layers formed of un-fragmented ferrite. The magnetic field shielding layer formed of fragmented ferrite and non-fragmented ferrite may be stacked to implement the magnetic field shielding unit.

As described above, the magnetic field shielding unit 100, 100′, 100″ for wireless power transmission according to an embodiment of the present disclosure is combined with other shielding units having different magnetic characteristics at a predetermined frequency, and the characteristics of the antennas using different frequency bands may be improved at the same time. Since it is possible to simultaneously improve the characteristics of the antennas using different frequency bands by using only the magnetic field shielding unit according to an embodiment of the present disclosure, it is not preferable to combine them with other shielding units having different magnetic characteristics at a predetermined frequency in terms of thinning of the magnetic field shielding unit.

In the meantime, the magnetic field shielding unit 100, 100′, or 100″ for wireless power transmission according to the above-described embodiments of the present disclosure may include at least one functional layer (not shown) for shielding the electromagnetic waves and/or radiating the heat. Accordingly, the magnetic field shielding unit having the functional layer may prevent the frequency fluctuation range of the antenna, which is combined due to the electromagnetic wave such as power supply noise, from being significantly increased, thereby reducing the defecting rate of the antenna. It is also possible to prevent a deterioration of durability of components due to heat generation, a deterioration of function, and a discomfort caused by heat transfer to the user.

In addition, if the functional layer provided on the top and/or bottom of the magnetic field shielding unit 100, 100′, 100″ has a heat-radiating function, the thermal conductivity of the magnetic field shielding unit in the horizontal direction may be improved.

Particularly, a functional layer such as an electromagnetic wave shielding layer, a heat radiating layer, and/or a composite layer in which these are stacked or a composite layer in which these layers are combined as a single layer may be provided on the upper portion of the protective member 140 of the magnetic field shielding layer 100 and/or on lower portion of the adhesive member 130. For example, a metal foil such as copper, aluminum, or the like, which is excellent in thermal conductivity and conductivity, may be attached to the upper portion of the protective member 140 through an adhesive agent or a double-sided tape. Or, Cu, Ni, Ag, Al, Au, Sn, Zn, Mn, Mg, Cr, Tw, Ti or the combination of these metals may be formed on the protective member 140 by a known method such as sputtering, vacuum deposition, chemical vapor deposition, or the like to form a metal thin film. When the functional layer is provided through an adhesive agent, the adhesive agent may be a known adhesive agent. As a non-limiting example, acrylic-based, urethane-based or epoxy-based adhesives may be used. On the other hand, a heat radiating function may be added to the above adhesive agent. For this purpose, known filler such as nickel, silver or carbon material may be mixed with the adhesive agent. The content of the filler may be such that the adhesive agent performance of the adhesive agent may not be deteriorated and the heat radiating performance can be exhibited. But the filler is not particularly limited thereto.

In addition, the thickness of the functional layer may be in the range of 5 μm to 100 μm, and more preferably 10 μm to 20 μm in order to reduce the thickness of the magnetic field shielding unit.

Figure 9:
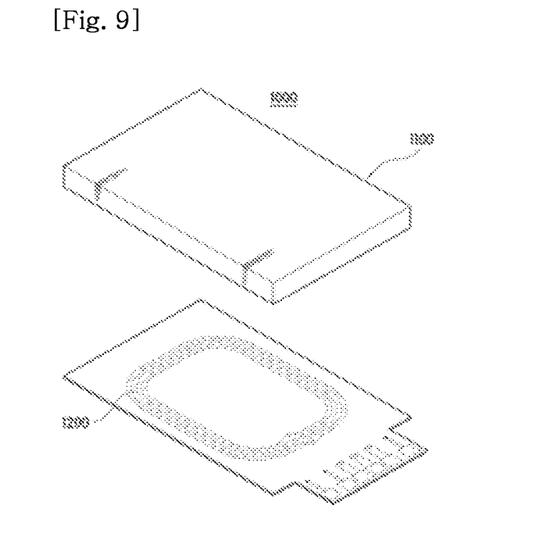
FIG. 9 is an exploded perspective view of a wireless power transmission module according to an embodiment of the present disclosure.

As shown in FIG. 9, the magnetic field shielding unit 1000 for wireless power transmission according to an embodiment of the present disclosure may be provided in the wireless power transmission module 1000 disposed on one side of the antenna unit including the wireless power transmission antenna 1200.

Here, the wireless power transmission module may be a transmission module that transmits power/signals to the electronic device, or a reception module that receives power/signals from the transmission module. The wireless power transmission antenna 1200 may be an antenna coil wound with a coil having a predetermined inner diameter or may be an antenna pattern printed with an antenna pattern on a substrate. Size, material, etc. are not particularly limited in the present disclosure.

Meanwhile, the wireless power transmission module according to an embodiment of the present disclosure is a combined module capable of simultaneously supporting heterogeneous functions by further comprising for the short-distance communication and/or the magnetic security transmission antenna.

Figure 10:
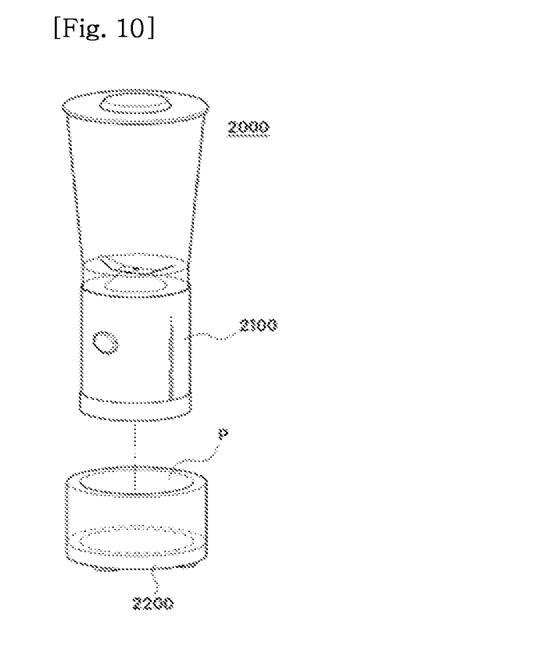
FIG. 10 is a view illustrating a blender, to which a wireless power transmission module according to an embodiment of the present disclosure is applied.
Figure 11:
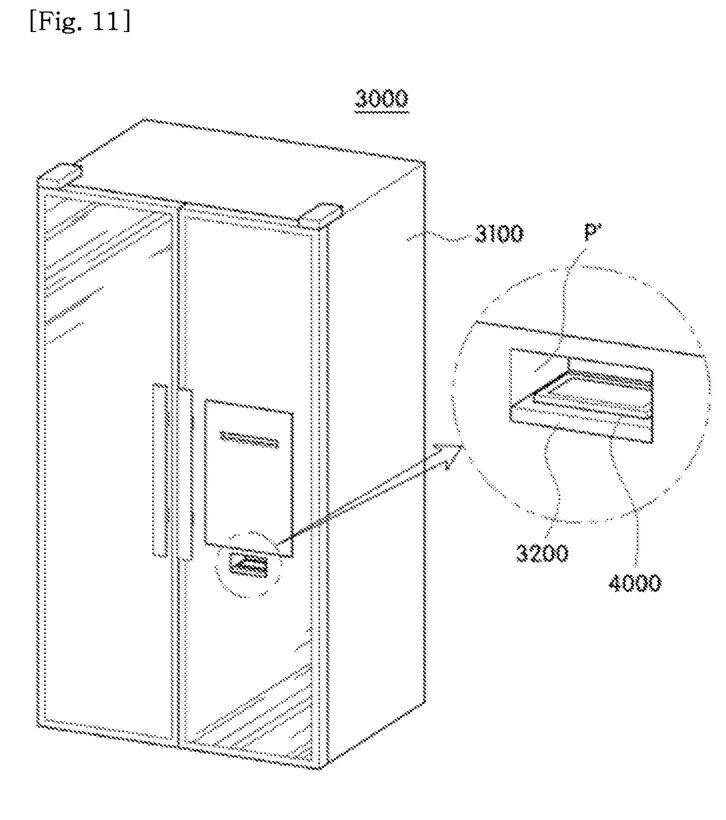
FIG. 11 is a view illustrating a refrigerator, to which a wireless power transmission module according to an embodiment of the present disclosure is applied.

In addition, the present disclosure can be implemented in electronic devices such as home appliances 2000 and 3000 having wireless power transmission modules (not shown) as shown in FIGS. 10 and 11. The home appliance is not limited to a specific device, but can be any known electronic device used in everyday life, and may be one selected from the group consisting of a refrigerator, an induction, a gas range, a vacuum cleaner, a speaker, a blender, and a television.

The wireless power transmission module may be provided in an electronic device as the module for transmitting and/or receiving the wireless power signal. Referring to FIG. 10, the blender 2000 may include a blender body 2100 and a holder 2200 of the blender body. At this time, the wireless power transmission module (not shown) may be provided on a side or lower side of the holder 2200 of the blender body. The wireless power receiving module (not shown) may be provided in the blender body 2100. In addition, a receiving space P in which the blender body 2100 can be received may be provided inside the holder 2200 of blender body. The wireless power receiving module of the blender body 2100 may receive the wireless power signal generated and transmitted from the wireless power transmitting module of the holder 2200 of blender body when the holder 2200 receives the blender body 2100 in the receiving space P. Thus, the blender body 2100 may be charged by wireless power transmission. Furthermore, the receiving space P provided in the holder 2200 of blender body may be utilized for wireless power transmission of other electronic devices such as portable phones.

Referring to FIG. 11, in the case of the refrigerator 3000, the wireless power transmission module 3200 may be provided on a side of a main body 3100 of the refrigerator 3000. The portable device 4000 having the wireless power receiving module may be received in the wireless power transmission space P' having the wireless power transmitting module 3200. The portable device 4000 may be charged by wireless power transmission.

As shown in FIG. 10 and FIG. 11, the wireless power transmission module according to the present disclosure may be applied to various electronic devices including home appliances. Thus, wireless electronic devices can be implemented, or various other electronic devices can be received in the wireless power transmission space P and P' formed in the electronic device, so that the wireless power can be transmitted.

Alternatively, the wireless power transmission module according to the present disclosure may be provided to various transportation means such as a vehicle, a subway, a train, a ship and an airplane for wireless power transmission. In this case, transmission of the wireless power signal to various portable devices provided with the wireless power receiving module carried by a passenger using the transportation means may be possible during use of the transportation means. This can greatly improve convenience in power usage. Here, the location of the wireless power transmission module in various transportation means may be changed according to the purpose, so that the present invention is not particularly limited thereto.

THE EMBODIMENTS OF PRESENT DISCLOSURE

The present disclosure will now be described more specifically with reference to the following embodiment of exemplary examples. However, the following the embodiment of exemplary examples should not be construed as limiting the scope of the present disclosure and should be construed to facilitate understanding of the present disclosure.

First, the following preparation examples were carried out in order to evaluate the physical properties according to the composition of the ferrite magnetic material.

Preparation Example 1

10 parts by weight of polyvinyl alcohol relative to 100 parts by weight of a ferrite powder having an average particle diameter of 0.75 μm (48.5 mol % of $Fe_2O_3$, 4.1 mol % of NiO, 28.8 mol % of ZnO, 10.3 mol % of CuO and 8.2 mol % of MgO) 50 parts by weight were mixed, dissolved and dispersed in a ball mill. Thereafter, the mixture was charged into a mold having cylindrical holes each having a diameter of 0.5 mm and a height of 0.5 mm and press-molded to produce granules. The granules thus prepared were molded into a mold having a final molding density of 3.2 g/cm$^3$ with an outer diameter of 18 mm, an inner diameter of 13 mm, and a thickness of 3.7 mm, followed by degreasing at 500 for 10 hours and calcining at 940 for 2.2 hours and cooled to produce bulk ferrite.

Preparation Examples 2 to 14

The ferrite powder was prepared in the same manner as in Preparation Example 1 except that the composition/composition ratio of the ferrite powder was changed as shown in Table 1 to prepare bulk ferrite as shown in Table 1 below.

Comparative Preparation Examples 1 to 2

The ferrite powder was prepared in the same manner as in Preparation Example 1 except that the composition/composition ratio of the ferrite powder was changed as shown in Table 2 to prepare bulk ferrite as shown in Table 2 below.

Experimental Example

The real and imaginary parts of the complex permeability were shown in Tables 1 to 2 by measuring the permeability at 100 kHz, 200 kHz and 13.56 MHz for the samples prepared according to the preparation examples and comparative preparation examples.

Specifically, the permeability was measured using an impedance analyzer (4294A Precision Impedance Analyzer and 42942A Terminal adapter kit). The test fixture was a 16454A magnetic body test fixture and measured at an Osc level of 500 mV.

TABLE 1

| | | Prep. Ex. 1 | Prep. Ex. 2 | Prep. Ex. 3 | Prep. Ex. 4 | Prep. Ex. 5 | Prep. Ex. 6 | Prep. Ex. 7 | Prep. Ex. 8 | Prep. Ex. 9 | Prep. Ex. 10 |
|---|---|---|---|---|---|---|---|---|---|---|---|
| Composition of Ferrite | $Fe_2O_3$ | 48.5 | 48.5 | 49.3 | 49.3 | 48.5 | 48.5 | 49.3 | 49.3 | 49.3 | 49.3 |
| | NiO | 4.1 | 4.6 | 4.6 | 2.5 | 3.1 | 3.6 | 5.6 | 6.6 | 7.6 | 7.1 |
| | ZnO | 28.8 | 28.3 | 27.9 | 27.9 | 29.9 | 29.3 | 27.9 | 27.9 | 27.9 | 25.4 |
| | CuO | 10.3 | 10.3 | 10.1 | 11.2 | 10.3 | 10.3 | 10.1 | 10.1 | 10.1 | 10.1 |
| | MgO | 8.2 | 8.2 | 8.1 | 9.1 | 8.2 | 8.2 | 7.1 | 6.1 | 5.1 | 8.1 |
| | Total | 100 | 100 | 100 | 100 | 100 | 100 | 100 | 100 | 100 | 100 |
| | ZnO(Mol %)/NiO(Mol %) | 7.02 | 6.15 | 6.06 | 11.16 | 9.65 | 8.14 | 4.98 | 4.23 | 3.67 | 3.58 |
| Density of Ferrite(g/cm$^3$) | | 5.08 | 5.09 | 5.06 | 5.1 | 5.07 | 5.09 | 5.08 | 5.1 | 5.15 | 5.08 |
| Permeability (100 KHz) | Real part | 1171 | 1084 | 1211 | 1318 | 1200 | 1220 | 1152 | 1081 | 1060 | 727 |
| | Imaginary part | 16 | 14 | 19 | 44 | 21 | 17 | 16 | 14 | 11 | 8 |
| Permeability (200 KHz) | Real part | 1171 | 1065 | 1208 | 1309 | 1202 | 1220 | 1150 | 1079 | 1058 | 724 |
| | Imaginary part | 22 | 18 | 22 | 41 | 30 | 26 | 19 | 17 | 15 | 8 |
| Permeability (13.56 MHz) | Real part | 178 | 190 | 195 | 189 | 144 | 164 | 201 | 210 | 219 | 217 |
| | Imaginary part | 336 | 337 | 364 | 360 | 304 | 327 | 363 | 365 | 374 | 328 |

(Prep. Ex.: Preparation Example)

TABLE 2

| | | Prep. Ex. 11 | Prep. Ex. 12 | Prep. Ex. 13 | Prep. Ex. 14 | Comp. prep. Ex. 1 | Comp. prep. Ex. 2 |
|---|---|---|---|---|---|---|---|
| Composition of Ferrite | $Fe_2O_3$ | 48.5 | 48.5 | 48.5 | 48.5 | 49.3 | 48.5 |
| | NiO | 10.6 | 9.6 | 1.5 | 0.7 | 9.6 | 13.1 |
| | ZnO | 28.3 | 28.3 | 28.3 | 28.3 | 22.8 | 28.3 |
| | CuO | 10.1 | 10.1 | 10.1 | 10.1 | 10.1 | 10.1 |
| | MgO | 2.5 | 3.5 | 11.6 | 12.4 | 8.1 | 0 |
| | Total | 100 | 100 | 100 | 100 | 100 | 100 |
| | ZnO (Mol %)/NiO (Mol %) | 2.7 | 2.9 | 18.9 | 40.4 | 2.4 | 2.2 |
| Density of Ferrite(g/cm$^3$) | | 5.21 | 5.18 | 5.03 | 5.02 | 5.07 | 5.23 |
| Permeability (100 KHz) | Real part | 718 | 796 | 1227 | 1262 | 472 | 657 |
| | Imaginary part | 71 | 51 | 23 | 38 | 6 | 87 |
| Permeability (200 KHz) | Real part | 722 | 798 | 1230 | 1263 | 469 | 661 |
| | Imaginary part | 70 | 63 | 25 | 28 | 5 | 93 |
| Permeability (13.56 MHz) | Real part | 329 | 287 | 185 | 184 | 239 | 412 |
| | Imaginary part | 342 | 341 | 334 | 332 | 279 | 368 |

As can be seen from Tables 1 and 2 above, it can be confirmed that the real part of the complex permeability is lower and the imaginary part is significantly higher than the preparation examples in Comparative Preparation Example 2 using ferrite not containing magnesium oxide.

In Comparative Preparation Example 1, it can be confirmed that the real part of the complex permeability does not satisfy 650 at a frequency of 100 kHz according to the composition ratio of nickel oxide, zinc oxide and copper oxide.

Further, in the case of Preparation Example 19 in which the content ratio of zinc oxide and nickel oxide is less than 3.6, it can be confirmed that the real part difference of the complex permeability is remarkable at the frequency of 100 kHz as compared to Preparation Example 9

It is also expected that Preparations Examples 1 to 10, 12, and 13 satisfying the preferable content range of magnesium oxide have a larger real and/or smaller imaginary number of complex permeability than Preparative Example 11 and Preparative Example 13.

Example Embodiment 100 parts by weight of ferrite powder having an average particle diameter of 0.75 mum (48.5 mol % of $Fe_2O_3$, 4.1 mol % of NiO, 28.8 mol % of ZnO, 10.3 mol % of CuO and 8.2 mol % of MgO) 5 parts by weight of polyvinylbutyral resin, and 50 parts by weight of a solvent, in which toluene and ethanol were mixed in a ratio of 5:5, were mixed, dissolved and dispersed in a ball mill. Thereafter, the ferrite mixture was made into a sheet shape through a conventional tape casting method, followed by degreasing at 500 for 10 hours and calcining and cooling at 940 for 2.2 hours to prepare a ferrite sheet having a final thickness of 80 μm.

Then, a double-sided tape (support base PET, CYWON CORPORATION, VT-8210C) having a thickness of 10 μm and attached with a release film was attached to one surface of the ferrite sheet. Thereafter, a PET protective member (International Latex, KJ-0714) having a thickness of 7 μm and an adhesive layer formed on one surface was attached to the other surface to manufacture the magnetic field shielding unit.

Example Embodiment 2

100 parts by weight of ferrite powder having an average particle diameter of 0.75 μm (48.5 mol % of $Fe_2O_3$, 4.1 mol % of NiO, 28.8 mol % of ZnO, 10.3 mol % of CuO and 8.2 mol % of MgO), 5 parts by weight of polyvinylbutyral resin, and 50 parts by weight of a solvent, in which toluene and ethanol were mixed in a ratio of 5:5, were mixed, dissolved and dispersed in a ball mill. Thereafter, the ferrite mixture was made into a sheet shape through a conventional tape casting method, followed by degreasing at 500 for 10 hours and calcining and cooling at 940 for 2.2 hours to prepare a ferrite sheet having a final thickness of 80 μm.

Then, a double-sided tape (support base PET, CYWON CORPORATION, VT-8210C) having a thickness of 10 μm and attached with a release film was attached to one surface of the ferrite sheet. Thereafter, a PET protective member (International Latex, KJ-0714) having a thickness of 7 μm and an adhesive layer formed on one surface was attached to the other surface, and then passed through the shredder through as shown in FIG. 6 to manufacture a magnetic shielding unit.

As described above, the present disclosure has been described with respect to particularly preferred embodiments. However, the present disclosure is not limited to the above embodiments, and it is possible for one who has an ordinary skill in the art to make various modifications and variations, without departing off the spirit of the present disclosure.

What is claimed is:

1. A magnetic field shielding unit for wireless power transmission comprising;
   a magnetic field shielding layer including a ferrite containing magnesium oxide (MgO),
   wherein the ferrite containing magnesium oxide has a real part ($\mu'$) of complex permeability of 650 or more at a frequency of 100 kHz,
   wherein number of ferrite fragments having at least one side having a curved shape, which is not a straight line, is 45% or more of a total number of the ferrite fragments,
   wherein the average thickness of the magnetic field shielding layer is 30 μm to 1 cm, and
   wherein the ferrite fragments include 30% or more ferrite fragments having a shape ratio of 8.0 or less according to the following Equation 2, Shape ratio=Diameter of circumscribed circle of a fragment (μm)/Diameter of inscribed circle of a fragment (μm).     [Equation 2]

2. The magnetic field shielding unit for wireless power transmission of claim 1, further comprising a protective member disposed on one surface of the magnetic field shielding layer, and a first adhesive member disposed on the other surface of the magnetic field shielding layer.

3. The magnetic field shielding unit for wireless power transmission of claim 1, wherein the ferrite containing magnesium oxide has a real part ($\mu'$) of the complex permeability of 650 or more at a frequency of 200 kHz.

4. The magnetic field shielding unit for wireless power transmission of claim 1, wherein the ferrite containing magnesium oxide has an imaginary part ($\mu''$) of the complex permeability of 50 or less at a frequency of 100 kHz.

5. The magnetic field shielding unit for wireless power transmission of claim 1, wherein the ferrite containing magnesium oxide has an imaginary part ($\mu''$) of the complex permeability of 50 or less at a frequency of 200 kHz.

6. The magnetic field shielding unit for wireless power transmission of claim 1, wherein the ferrite includes a magnesium oxide of 3 mol % to 12 mol %, and further includes a copper oxide of 8 mol % to 14 mol %, a nickel oxide and a zinc oxide, and wherein contents of the nickel oxide and the zinc oxide are values such that a ratio calculated by following Equation 1 is 3.6 or more, Content of the zinc oxide in the ferrite (mol %)/Content of the nickel oxide in the ferrite (mol %).     [Equation 1]

7. The magnetic field shielding unit for wireless power transmission of claim 1, wherein the ferrite includes a magnesium oxide of 3 mol % to 12 mol % and an iron oxide of 46 weight % to 52 weight %, and further includes a copper oxide 8 mol % to 14 mol %, a nickel oxide of 1 mol % to 10 mol %, and a zinc oxide of 25 mol % to 32 mol %.

8. The magnetic field shielding unit for wireless power transmission of claim 1, wherein the magnetic field shield layer is formed of ferrite fragments in which ferrite containing magnesium oxide is shredded to improve the flexibility of the magnetic field shielding unit.

9. The magnetic field shielding unit for wireless power transmission of claim 1, wherein the ferrite including the magnesium oxide has a real part (μ') of the complex permeability of 1000 or more at a frequency of 100 kHz.

10. A wireless power transmission module, comprising;
an antenna unit including a wireless power transmission antenna; and
a magnetic field shielding unit for wireless power transmission, according to claim 1, disposed on one surface of the antenna unit to improve characteristics of the antenna and condense a magnetic field toward the antenna.

11. A home appliance comprising a wireless power transmission module, according to claim 10.

12. The home appliance comprising the wireless power transmission module of claim 11, wherein the home appliance is at least one selected from the group consisting of a refrigerator, an induction, a gas range, a vacuum cleaner, a speaker, a blender, and a television.

13. The home appliance comprising the wireless power transmission module of claim 11, wherein the wireless power transmission module includes a transmission module or a reception module.

14. A transportation means comprising a wireless power transmission module, according to claim 10, as a transmission module.

* * * * *